United States Patent
Ting et al.

(10) Patent No.: US 12,217,924 B2
(45) Date of Patent: Feb. 4, 2025

(54) HEAT CONTROLLED SWITCH

(71) Applicant: Taiwan Semiconductor Manufacturing Company, Ltd., Hsinchu (TW)

(72) Inventors: Yu-Wei Ting, Taipei (TW); Kuo-Pin Chang, Hsinchu (TW); Hung-Ju Li, Hsinchu (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 416 days.

(21) Appl. No.: 17/834,944

(22) Filed: Jun. 8, 2022

(65) Prior Publication Data

US 2023/0402241 A1    Dec. 14, 2023

(51) Int. Cl.
*H10N 10/85* (2023.01)
*H01H 37/12* (2006.01)
*H01H 37/32* (2006.01)

(52) U.S. Cl.
CPC .............. *H01H 37/12* (2013.01); *H01H 37/32* (2013.01); *H10N 10/85* (2023.02)

(58) Field of Classification Search
CPC ........ H01H 37/12; H01H 37/32; H01H 15/10; H01H 15/005; H01H 2221/062; H10N 10/85
See application file for complete search history.

(56) References Cited

U.S. PATENT DOCUMENTS 11,424,406 B2 *  8/2022  Lai ...................... H10N 70/841

FOREIGN PATENT DOCUMENTS

TW   202006941 A   2/2020
TW   202008514 A   2/2020

OTHER PUBLICATIONS

Notice of Allowance received in the corresponding Taiwan application 112118585, mailed Oct. 17, 2023.

* cited by examiner

*Primary Examiner* — David Vu
(74) *Attorney, Agent, or Firm* — Kilpatrick Townsend & Stockton LLP

(57) ABSTRACT

A semiconductor device is disclosed. The semiconductor device includes a semiconductor substrate, and a heater element on the semiconductor substrate, the heater element configured to generate heat in response to a current flowing therethrough. The semiconductor device also includes a conductor material having a programmable conductivity, and an insulator layer between the heater element and the conductor material, where the conductor material is configured to be programmed by applying one or more voltage differences to one or more of the heater element and the conductor material, and where a capacitance between the conductor material and the heater element is configured to be controlled by the voltage differences such that the capacitance is lower while the conductor material is being programmed than while the conductor material is not being programmed.

20 Claims, 7 Drawing Sheets

HEAT CONTROLLED SWITCH

TECHNICAL FIELD

The subject matter described herein relates to heat controlled switches, and more particularly to low capacitance heat controlled switches.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate. The layers collectively form semiconductor devices.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1A:
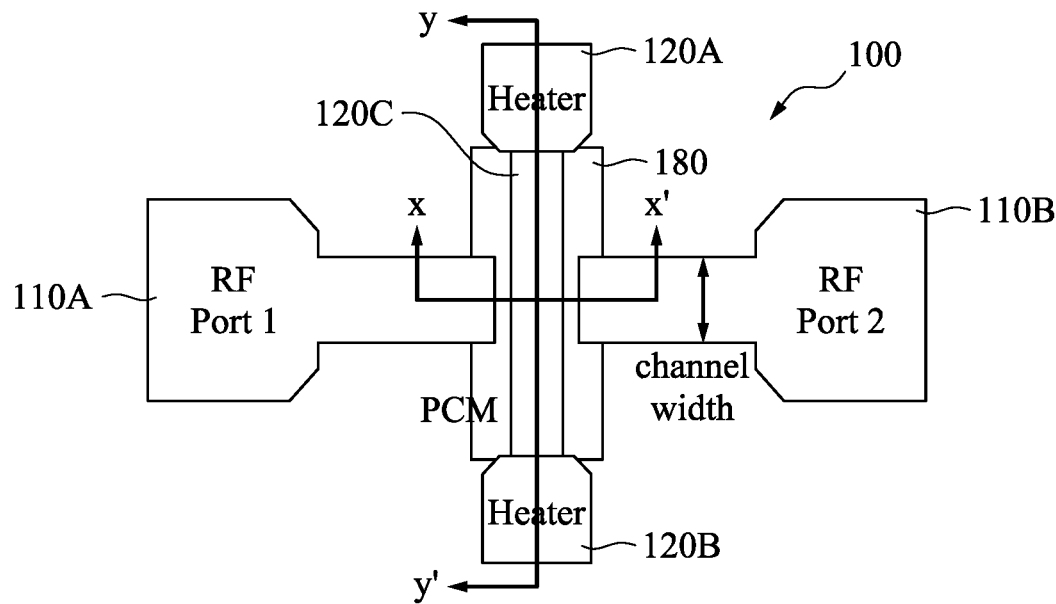
FIGS. 1A-1C are a schematic illustrations of a semiconductor heat controlled switch according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Some types of switches use a phase change material (PCM) as a conductor material may be formed using semiconductor processing steps, such as those discussed below. The conductivity state of a heat controlled switch is determined using a programming process, during which the PCM is heated according to a particular temperature profile corresponding with the desired conductivity state of the heat controlled switch. For example, a first programming profile may be used to cause the PCM to have a low-resistance, where the first programming profile applies a first temperature, greater than an operating temperature of the heat controlled switch, to the heat controlled switch for a particular first time duration. In addition, a second programming profile may be used to cause the PCM to have a high resistance, where the second programming profile applies a second temperature, greater than an operating temperature of the heat controlled switch, and greater than the first temperature, to the controlled switch for a particular second time duration.

In the illustrated embodiments, the PCM is used to form a heat controlled switch. In some embodiments, the switch or the PCM may be used to form a nonvolatile PCM memory according to various inventive aspects discussed herein as applied with semiconductor manufacturing techniques used to form a PCM memory, according to principles understood by those of skill in the art. PCM memory is a type of nonvolatile memory in which a phase of a PCM is employed to represent a unit of data. PCM has fast read and write times, non-destructive reads, and high scalability.

As understood by those of skill in the art, capacitances formed by the structures constituting a heat controlled switch cause signal losses and increased power consumption. Embodiments disclosed herein are examples of heat control switches having reduced capacitances because of a depletion region in the heater elements. Accordingly the embodiments result in improved signal integrity and reduced power consumption.

The features of the embodiments described herein may be applied to other types of devices.

Figure 1B:
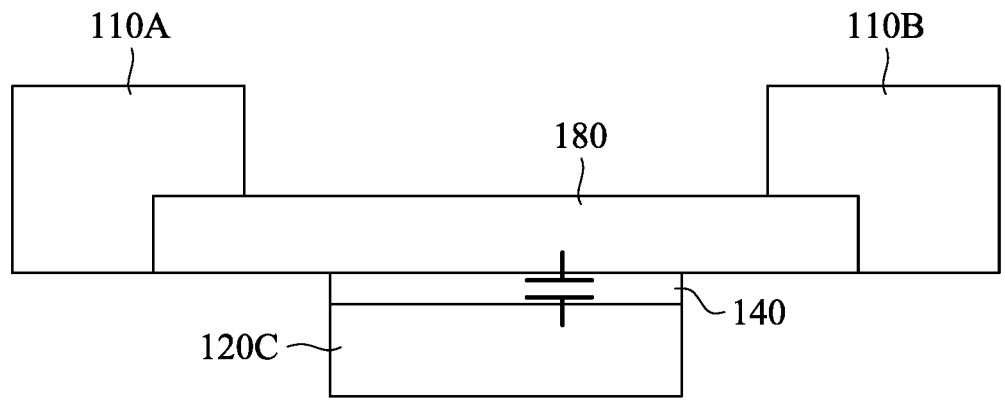
Figure 1C:
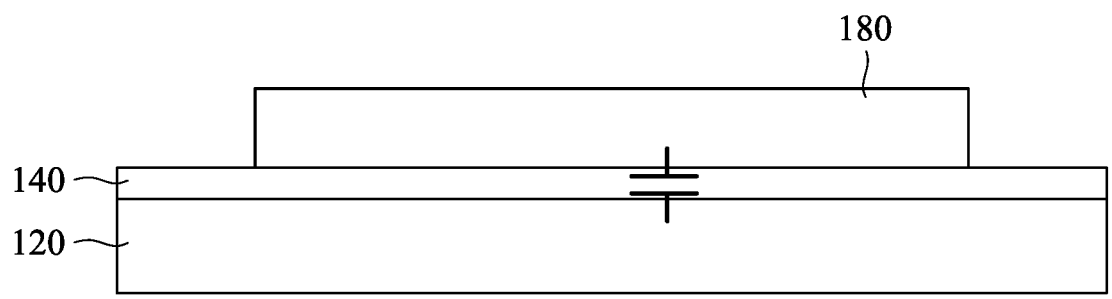

FIGS. 1A-1C are schematic illustrations of a semiconductor heat controlled switch according to some embodiments. FIG. 1A is a top down plan view of the semiconductor heat control switch 100 according to some embodiments. FIG. 1B is a cross-sectional view of the semiconductor heat control switch 100 taken along a cross-section indicated in FIG. 1A as x-x'. FIG. 1C is a cross-sectional view of the semiconductor heat control switch 100 taken along a cross-section indicated in FIG. 1A as y-y'.

As illustrated in FIGS. 1A-1C, semiconductor heat control switch 100 includes a heater 120 comprising first and second heater connections 120A and 120B, and comprising heater element 120C. A temperature of heater element 120C may be controlled by forcing a predetermined amount of current through heater element 120C by applying a corresponding voltage difference across first and second heater connections 120A and 120B. Accordingly, applying a voltage difference across first and second heater connections 120A and 120B causes a corresponding current to be conducted through heater element 120C, and the current flowing through heater element 120C causes the temperature of heater element 120C to increase.

As illustrated in FIGS. 1A-1C, semiconductor heat control switch 100 also includes a phase change material (PCM) 180. The conductivity state of PCM 180 is determined using a programming process, during which the PCM 180 is heated with heater 120 according to a particular temperature profile corresponding with the desired conductivity state of the PCM 180. For example, a first programming profile may be used to cause the PCM 180 to have a low-resistance, where the first programming profile applies a first temperature, greater than an operating temperature of the semiconductor heat control switch 100, to the semiconductor heat control switch 100 for a particular first time duration. In addition, a second programming profile may be used to cause the PCM 180 to have a high resistance, where the second programming profile applies a second temperature, greater than an operating temperature of the semiconductor heat control switch 100, and greater than the first temperature, to the semiconductor heat control switch 100 for a particular second time duration.

As illustrated in FIGS. 1A-1C, semiconductor heat control switch 100 also includes first and second terminals 110A and 110B. First and second terminals 110A and 110B are mechanically connected by at least a portion of PCM 180, for example, as illustrated. First and second terminals 110A and 110B are each electrically connected to different portions of PCM 180, for example, as illustrated.

Accordingly, at least a portion of PCM 180 is included in an electrical path between first and second terminals 110A and 110B. For example, as illustrated, and electrical path between first and second terminals 110A and 110B may start at first terminal 110A, and continue through each of a first conductor electrically connecting first terminal 110A to PCM 180, PCM 180, a second conductor electrically connecting PCM 180 to second terminal 110B, and second terminal 110B.

Therefore, the electrical conductivity of the electrical path between first and second terminals 110A and 110B includes the electrical conductivity of PCM 180. Accordingly, the electrical conductivity of the electrical path between first and second terminals 110A and 110B may be controlled or programmed by controlling or programming the conductivity state of PCM 180 by applying voltage differences across first and second heater connections 120A and 120B.

Figure 2:
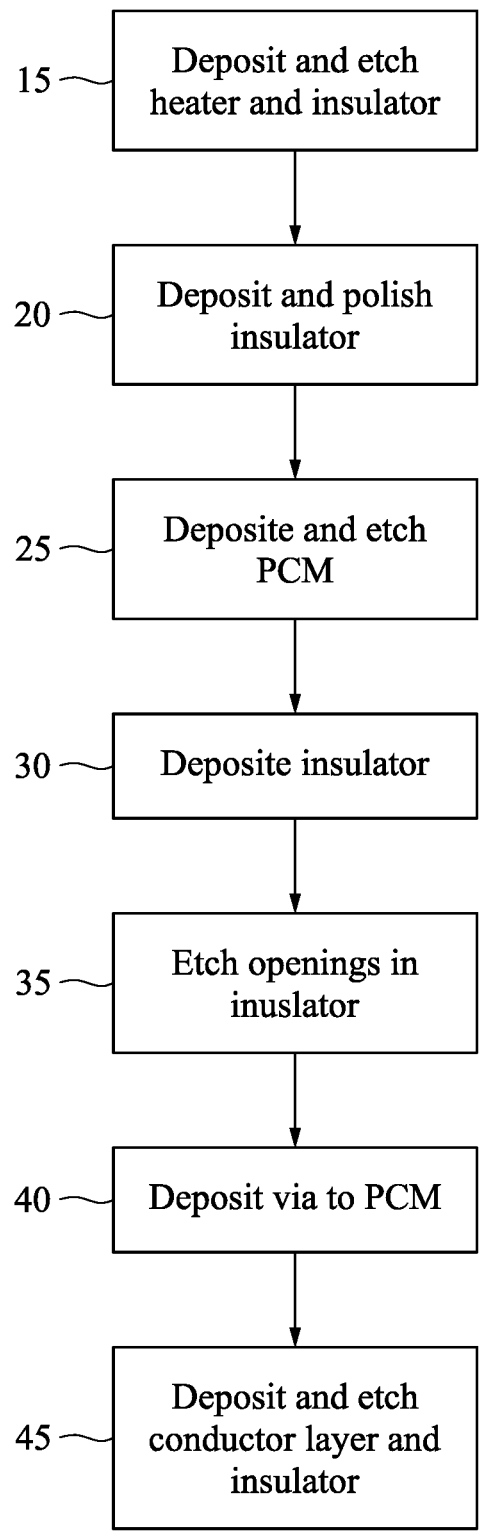
FIG. 2 is a schematic illustration of a flowchart diagram illustrating a method of forming a semiconductor heat controlled switch according to some embodiments.

FIG. 2 is a schematic illustration of a flowchart diagram illustrating a method 10 of forming a semiconductor device according to some embodiments. The semiconductor device includes a heat controlled switch formed between conductor layers in a back end of line (BEOL) interconnect formation process.

FIGS. 3A-7C illustrate schematic diagrams of semiconductor heat control switch 100 formed on a semiconductor substrate at various stages of the method 10 of FIG. 2 according to some embodiments.

The semiconductor substrate, may include a plurality of functional areas (not shown) fabricated on a single substrate. The functional areas may each include circuitry (not shown) formed on the semiconductor substrate, such as semiconductor structures for processing signals received from or transmitted to other semiconductor structures, for example, to other circuitry formed on the semiconductor substrate, or another system or chip.

The semiconductor substrate also includes metallization layers and vias. As depicted, the semiconductor substrate is fabricated to have a metallization layer Mx-1 170 formed in an interlayer dielectric 160. Metallization layer Mx-1 170 may be electrically connected to circuitry formed on the semiconductor substrate, for example, in one or more areas. Other embodiments may contain additional metallization layers and additional vias. The interlayer dielectric 160 may provide electrical insulation as well as structural support for the various features of the semiconductor substrate during many fabrication process steps and afterwards.

In some embodiments, the interlayer dielectric 160 includes silicon dioxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the interlayer dielectric 160 may include low-k dielectric material with a dielectric constant lower than 4, or extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The interlayer dielectric 160 may be a single layer structure or a multi-layer structure. The interlayer dielectric 160 may be formed, for example, by CVD, PECVD, FCVD, spin coating, or the like. In some embodiments, the interlayer dielectric 160 may be planarized using a planarization process, such as chemo-mechanical planarization (CMP).

Figure 3A:
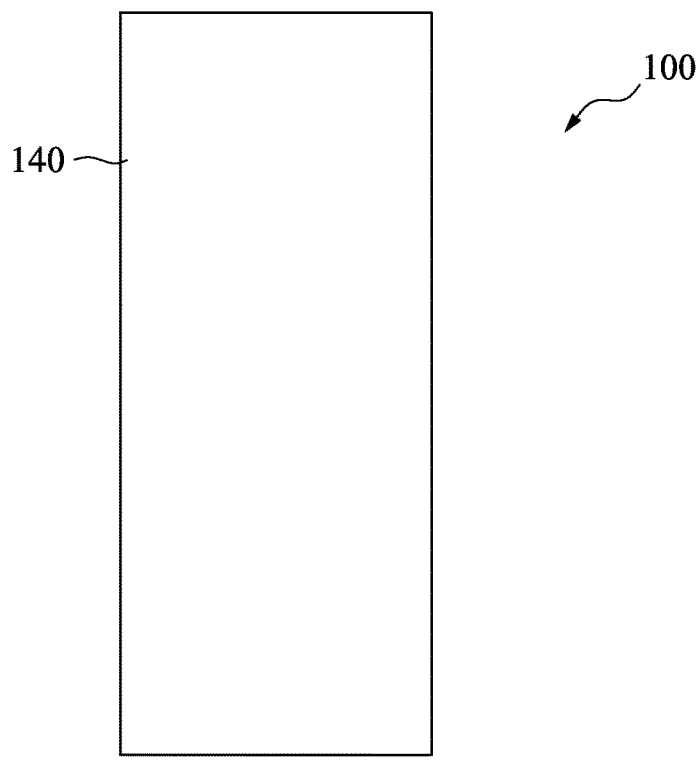
FIGS. 3A-7C illustrate schematic diagrams of a heat controlled switch at various stages of the method of FIG. 2 according to some embodiments.
Figure 3B:
Figure 3C:
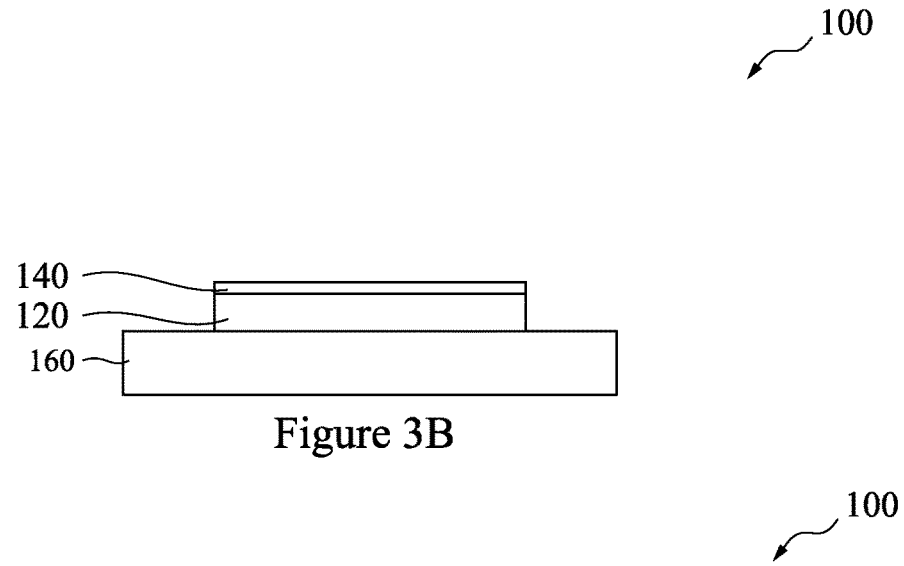

FIGS. 3A-3C illustrate schematic diagrams of semiconductor heat control switch 100 after block 15 of method 10 of FIG. 2 has been performed. FIG. 3A is a top down plan view of the semiconductor heat control switch 100 according to some embodiments. FIG. 3B is a cross-sectional view of the semiconductor heat control switch 100 taken along a cross-section indicated in FIG. 1A as x-x'. FIG. 3C is a cross-sectional view of the semiconductor heat control switch 100 taken along a cross-section indicated in FIG. 1A as y-y'.

As shown, FIGS. 3A-3C illustrate a semiconductor substrate, on which a heater 120 and an insulator layer 140 have been formed.

Various embodiments of heater 120 and methods of forming heater 120 are discussed in further detail below.

The insulator layer 140 may comprise one or more layers may include silicon oxide ($SiO_2$), silicon nitride (e.g. SiN or $Si_3N_4$), silicon oxynitride (SiON), silicon carbon nitride (SiCN), silicon oxycarbide nitride (SiOCN), silicon oxycarbide (SiOC), other similar, or a combination thereof. In some embodiments, the insulator layer 140 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the insulator layer 140. The insulator layer 140 may, for example, have a thickness equal to about 10 Å, about 25 Å, about 50 Å, about 75 Å, about 100 Å, about 200 Å, about 300 Å, about 400 Å, about 500 Å, about 600 Å, about 700 Å, about 800 Å, about 900 Å, about 1000 Å, about 1100 Å, about 1200 Å, about 1300 Å, about 1400 Å, or about 1500 Å. In some embodiments, the insulator layer 140 has another thickness.

In some embodiments, heater 120 and insulator layer 140 are etched using a photolithographic etching process to form the illustrated structures. In some embodiments, the etching process may include a plasma-induced etching process, a wet etch process, or another etching process known to those of skill in the art. For example, the etching process may include a RIE, NBE, or other etching processes. In some embodiments, the etching process may include a planarization process, such as chemo-mechanical planarization (CMP).

In some embodiments, other suitable processes may be used to form heater 120 and insulator layer 140.

Figure 4A:
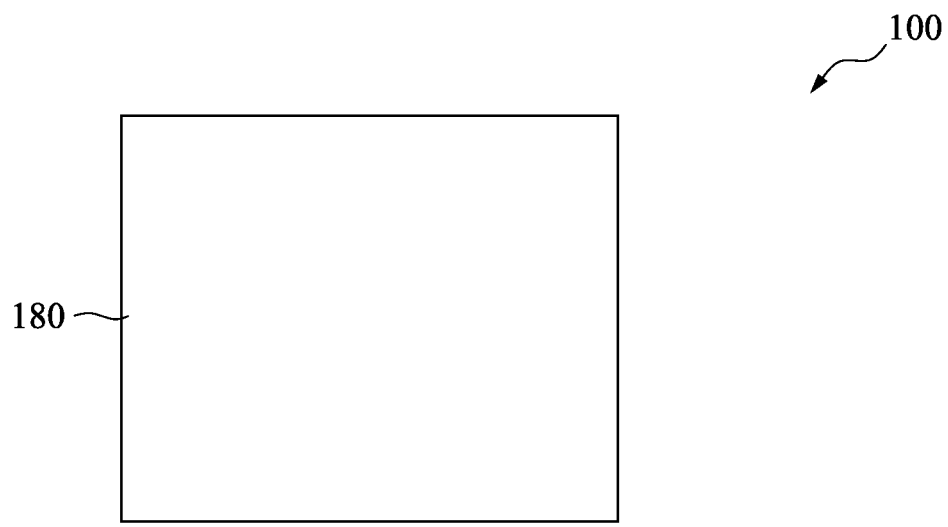
Figure 4B:
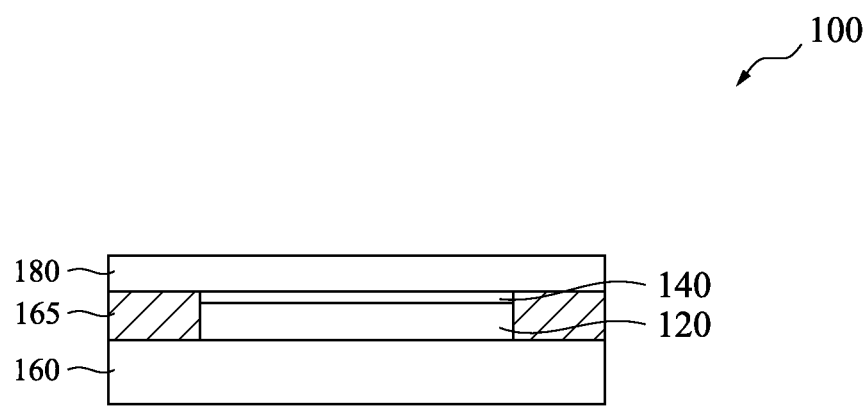
Figure 4C:
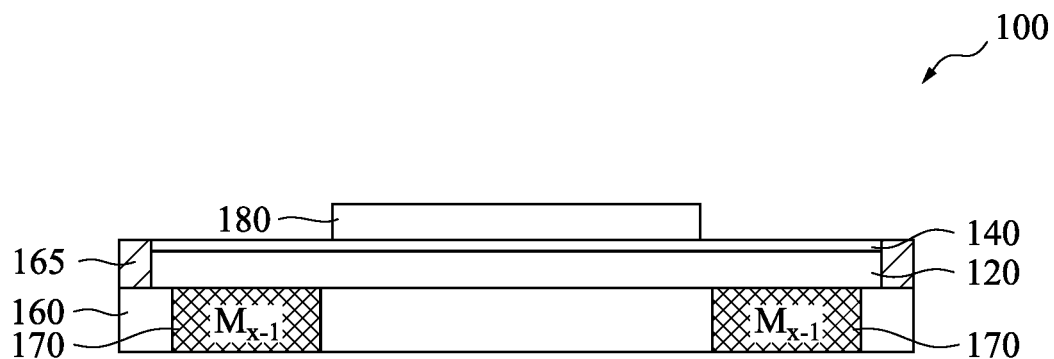

FIGS. 4A-4C illustrate schematic diagrams of semiconductor heat control switch 100 after blocks 20 and 25 of method 10 of FIG. 2 have been performed. FIG. 4A is a top down plan view of the semiconductor heat control switch 100 according to some embodiments. FIG. 4B is a cross-sectional view of the semiconductor heat control switch 100 taken along a cross-section indicated in FIG. 1A as x-x'. FIG. 4C is a cross-sectional view of the semiconductor heat control switch 100 taken along a cross-section indicated in FIG. 1A as y-y'.

As shown, FIGS. 4A-4C illustrate a semiconductor substrate, on which a dielectric layer 165 has been formed and polished.

In some embodiments, the dielectric layer 165 includes silicon dioxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 165 may include low-k dielectric material with a dielectric constant lower than 4, or extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The dielectric layer 165 may be a single layer structure or a multi-layer structure. The dielectric layer 165 may be formed, for example, by CVD, PECVD, FCVD, spin coating, or the like. In some embodiments, the dielectric layer 165 may be planarized using a planarization process, such as chemo-mechanical planarization (CMP).

As shown, FIGS. 4A-4C illustrate a semiconductor substrate, on which a phase change material (PCM) 180 has been formed.

The PCM 180 may include a chalcogenide material, such as an indium (In)-antimony (Sb)-tellurium (Te) (IST) material or a germanium (Ge)-antimony (Sb)-tellurium (Te) (GST) material. The ISG material may include In2Sb2Te5, In1Sb2Te4, In1Sb4Te7, or the like. The GST material may include Ge8Sb5Te8, Ge2Sb2Te5, Ge1Sb2Te4, Ge1Sb4Te7, Ge4Sb4Te7, Ge4SbTe2, Ge6SbTe2, or the like. The hyphenated chemical composition notation, as used herein, indicates the elements included in a particular mixture or compound, and is intended to represent all stoichiometries involving the indicated elements. Other phase change materials may be used, such as those which include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other storage element materials include transition metal oxide materials or alloys including two or more metals, such as transition metals, alkaline earth metals, and/or rare earth metals. Embodiments are not limited to a particular material or materials.

In some embodiments, PCM 180 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the PCM 180.

The PCM 180 may, for example, have a thickness equal to about 10 Å, about 25 Å, about 50 Å, about 75 Å, about 100 Å, about 200 Å, about 300 Å, about 400 Å, about 500 Å, about 600 Å, about 700 Å, about 800 Å, about 900 Å, about 1000 Å, about 1100 Å, about 1200 Å, about 1300 Å, about 1400 Å, or about 1500 Å. In some embodiments, the PCM 180 has another thickness.

In some embodiments, PCM 180 is etched using a photolithographic etching process to form the illustrated structures. In some embodiments, the etching process may include a plasma-induced etching process, a wet etch process, or another etching process known to those of skill in the art. For example, the etching process may include a RIE, NBE, or other etching processes. In some embodiments, the etching process may include a planarization process, such as chemo-mechanical planarization (CMP).

In some embodiments, other suitable processes may be used to form PCM 180.

Figure 5A:
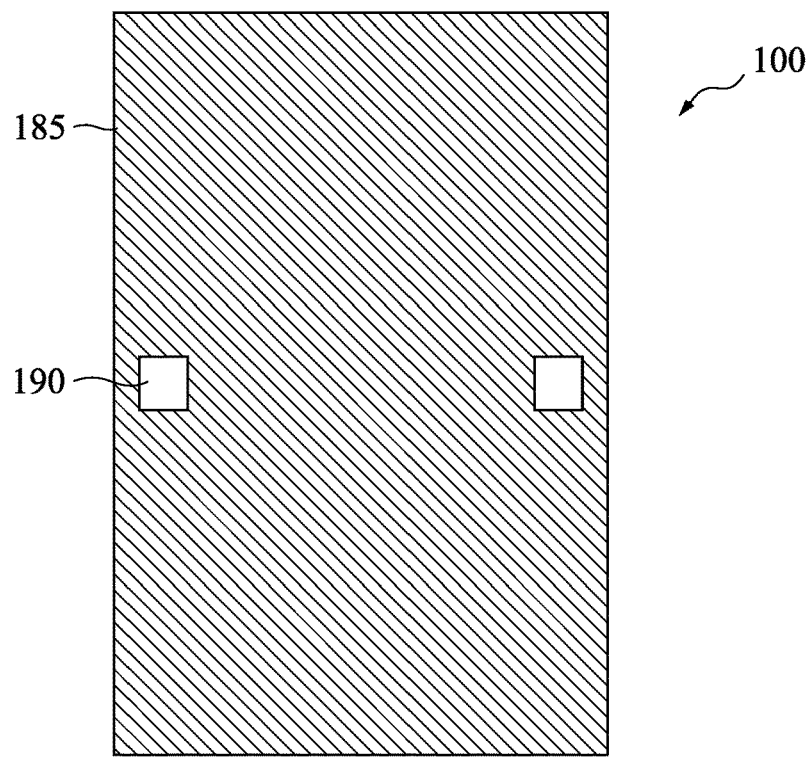
Figure 5B:
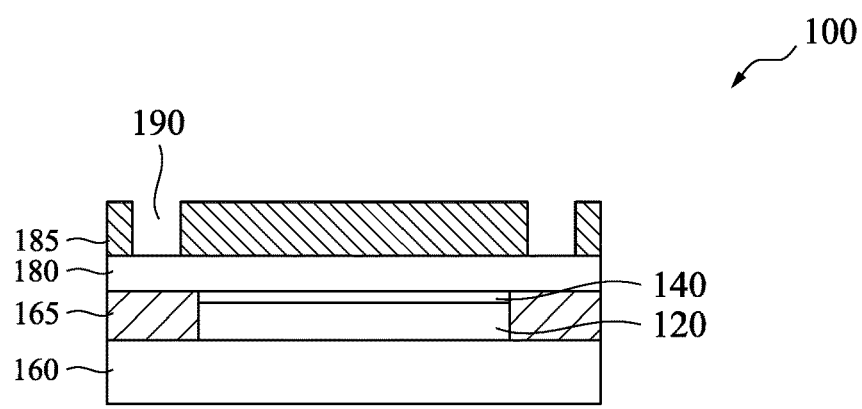
Figure 5C:
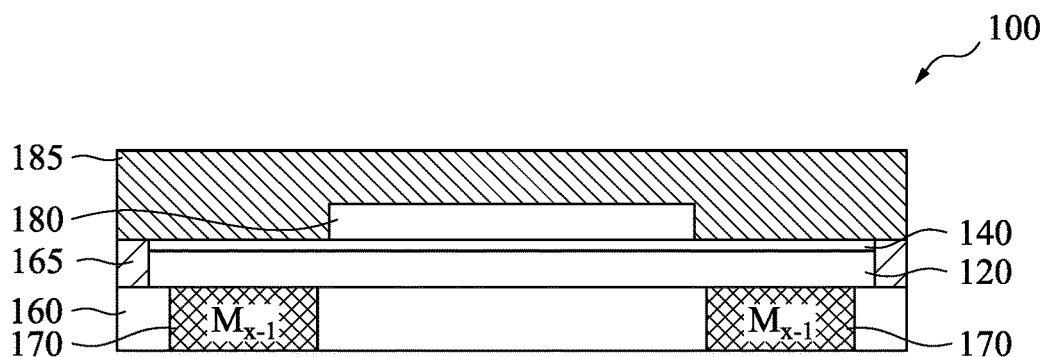

FIGS. 5A-5C illustrate schematic diagrams of semiconductor heat control switch 100 after blocks 30 and 35 of method 10 of FIG. 2 have been performed. FIG. 5A is a top down plan view of the semiconductor heat control switch 100 according to some embodiments. FIG. 5B is a cross-sectional view of the semiconductor heat control switch 100 taken along a cross-section indicated in FIG. 1A as x-x'. FIG. 5C is a cross-sectional view of the semiconductor heat control switch 100 taken along a cross-section indicated in FIG. 1A as y-y'.

As shown, FIGS. 5A-5C illustrate a semiconductor substrate, on which a dielectric layer 185 has been formed and polished.

In some embodiments, the dielectric layer 185 includes silicon dioxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 185 may include low-k dielectric material with a dielectric constant lower than 4, or extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The dielectric layer 185 may be a single layer structure or a multi-layer structure. The dielectric layer 185 may be formed, for example, by CVD, PECVD, FCVD, spin coating, or the like. In some embodiments, the dielectric layer 185 may be planarized using a planarization process, such as chemo-mechanical planarization (CMP).

As shown, FIGS. 5A-5C illustrate a semiconductor substrate, where dielectric layer 185 has been etched to form via openings 190.

In some embodiments, dielectric layer 185 is etched to form via openings 190 using a photolithographic etching process to form the illustrated structures. In some embodiments, the etching process may include a plasma-induced etching process, a wet etch process, or another etching process known to those of skill in the art. For example, the etching process may include a RIE, NBE, or other etching processes. In some embodiments, the etching process may include a planarization process, such as chemo-mechanical planarization (CMP).

In some embodiments, other suitable processes may be used to form dielectric layer 185.

Figure 6A:
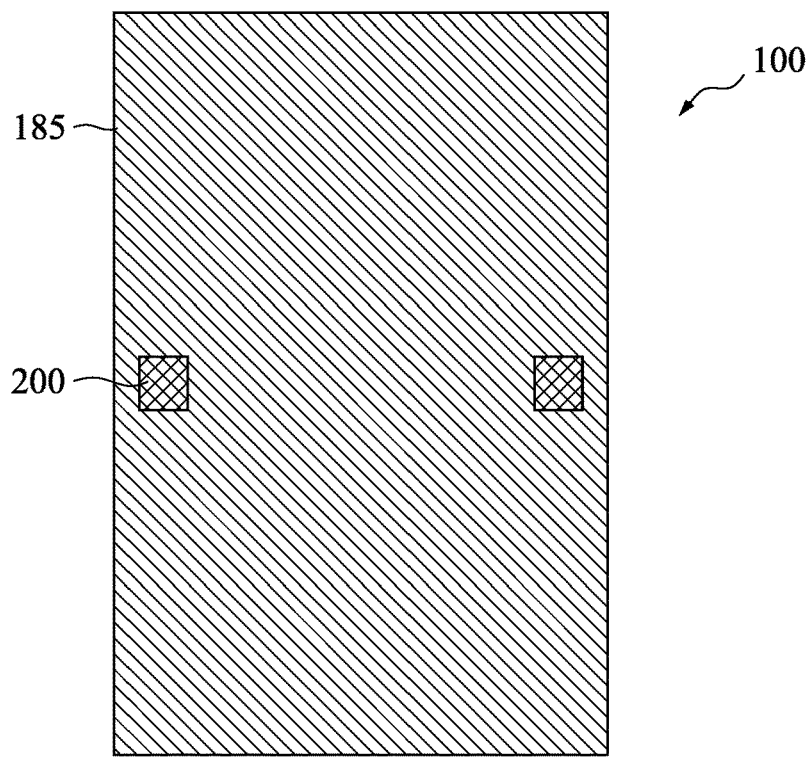
Figure 6B:
Figure 6C:

FIGS. 6A-6C illustrate schematic diagrams of semiconductor heat control switch 100 after block 40 of method 10 of FIG. 2 has been performed. FIG. 6A is a top down plan view of the semiconductor heat control switch 100 according to some embodiments. FIG. 6B is a cross-sectional view of the semiconductor heat control switch 100 taken along a cross-section indicated in FIG. 1A as x-x'. FIG. 6C is a cross-sectional view of the semiconductor heat control switch 100 taken along a cross-section indicated in FIG. 1A as y-y'.

As shown, FIGS. 6A-6C illustrate a semiconductor substrate, where vias 200 have been formed in via openings 190.

Vias 200 are conductive, and may, for example, be formed so as to include one or more of Cu, Ag, Pt, Au, W, Ti, TiN, TaN, Ru, and Mo. In some embodiments, other materials may be used. The vias 200 may, for example, have a thickness equal to about 10 Å, about 25 Å, about 50 Å, about 75 Å, about 100 Å, about 200 Å, about 300 Å, about 400 Å, about 500 Å, about 600 Å, about 700 Å, about 800 Å, about 900 Å, or about 1000 Å. In some embodiments, the vias 200 have another thickness. In some embodiments, the vias 200 are formed by one or more of chemical vapor deposition (CVD), a variety of suitable processes including CVD, low pressure CVD (LPCVD), plasma-enhanced CVD (PECVD), and atomic layer deposition (ALD). In some embodiments, the vias 200 are formed using an etching process which may include a planarization process, such as chemo-mechanical planarization (CMP). In some embodiments, other suitable processes may be used to form the vias 200.

In some embodiments, other suitable processes may be used to form via openings 190.

Figure 7A:
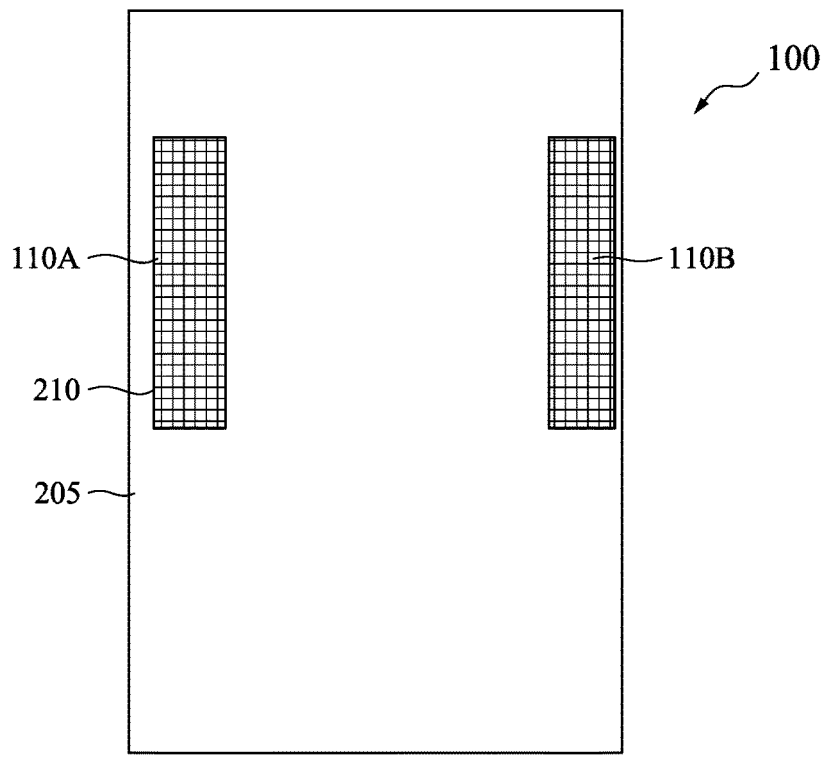
Figure 7B:
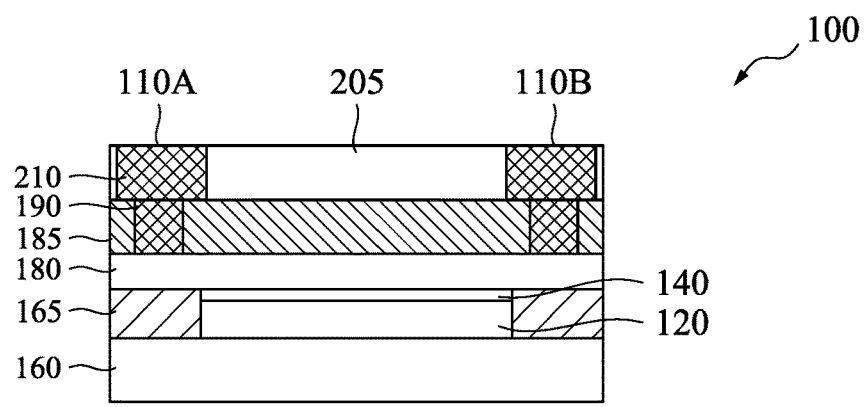
Figure 7C:
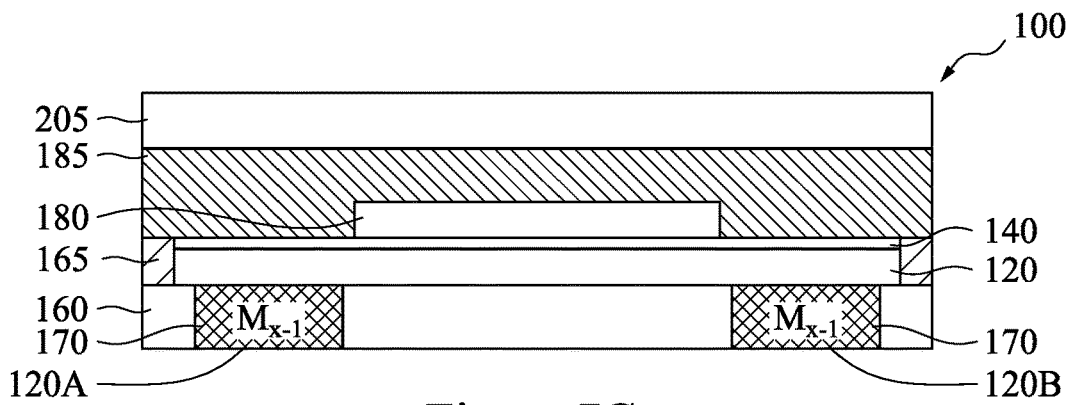

FIGS. 7A-7C illustrate schematic diagrams of semiconductor heat control switch 100 after block 45 of method 10 of FIG. 2 has been performed. FIG. 7A is a top down plan view of the semiconductor heat control switch 100 according to some embodiments. FIG. 7B is a cross-sectional view of the semiconductor heat control switch 100 taken along a cross-section indicated in FIG. 1A as x-x'. FIG. 7C is a cross-sectional view of the semiconductor heat control switch 100 taken along a cross-section indicated in FIG. 1A as y-y'.

As shown, FIGS. 7A-7C illustrate a semiconductor substrate, where dielectric layer 205 and metallization layer 210 have been formed.

In some embodiments, the dielectric layer 205 includes silicon dioxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 205 may include low-k dielectric material with a dielectric constant lower than 4, or extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The dielectric layer 205 may be a single layer structure or a multi-layer structure. The dielectric layer 205 may be formed, for example, by CVD, PECVD, FCVD, spin coating, or the like. In some embodiments, the dielectric layer 205 may be planarized using a planarization process, such as chemo-mechanical planarization (CMP).

In some embodiments, dielectric layer 205 is etched to form conductor openings using a photolithographic etching process to form the illustrated structures. In some embodiments, the etching process may include a plasma-induced etching process, a wet etch process, or another etching process known to those of skill in the art. For example, the etching process may include a RIE, NBE, or other etching processes. In some embodiments, the etching process may include a planarization process, such as chemo-mechanical planarization (CMP).

Metallization layer 210 is conductive, and may, for example, be formed so as to include one or more of Cu, Ag, Pt, Au, W, Ti, TiN, TaN, Ru, and Mo. In some embodiments, other materials may be used. The metallization layer 210 may, for example, have a thickness equal to about 10 Å, about 25 Å, about 50 Å, about 75 Å, about 100 Å, about 200 Å, about 300 Å, about 400 Å, about 500 Å, about 600 Å, about 700 Å, about 800 Å, about 900 Å, or about 1000 Å. In some embodiments, the vias 200 have another thickness. In some embodiments, the vias 200 are formed by one or more of chemical vapor deposition (CVD), a variety of suitable processes including CVD, low pressure CVD (LPCVD), plasma-enhanced CVD (PECVD), and atomic layer deposition (ALD).

The metallization layer 210 may also be patterned using a photolithographic etching process. In some embodiments, the etching process may include a plasma-induced etching process, a wet etch process, or another etching process known to those of skill in the art. In some embodiments, the metallization layer 210 is formed using an etching process which may include a planarization process, such as chemo-mechanical planarization (CMP). In some embodiments, other suitable processes may be used to form the metallization layer 210.

In some embodiments, other suitable processes may be used to form dielectric layer 205 and metallization layer 210. Embodiments of Heater 120 and Methods of Forming Heater 120
Doping Profile Implementation In some embodiments, heater 120 is formed by depositing and etching a semiconductor material. In some embodiments, the semiconductor material is amorphous. In some embodiments, the semiconductor material is polycrystalline. In some embodiments the semiconductor material is substantially single-crystalline.

In some embodiments, the semiconductor material comprises at least one of: silicon and one or more other semiconductor materials known to those of skill in the art.

In some embodiments, the semiconductor material is deposited by one or more of a sputtering process, a chemical vapor deposition (CVD), a variety of suitable processes including CVD, low pressure CVD (LPCVD), plasma-enhanced CVD (PECVD), and atomic layer deposition (ALD), or a crystal growth process, such as an epitaxial crystal growth process.

In some embodiments, the semiconductor material is formed with a thickness equal to about 10 Å, about 20 Å, about 25 Å, about 50 Å, about 75 Å, about 100 Å, about 200 Å, about 300 Å, about 400 Å, about 500 Å, about 600 Å, about 700 Å, about 800 Å, about 900 Å, about 1000 Å, about 1100 Å, about 1200 Å, about 1300 Å, about 1400 Å, about 1500 Å, about 1600 Å, about 1700 Å, about 1800 Å, about 1900 Å, or about 2000 Å.

In some embodiments semiconductor material is doped, for example, using an implant process. By way of example and not limitation, semiconductor material can be doped during the process of forming source/drain regions in transistor devices. By way of example and not limitation, a sacrificial hard mask layer can be formed on the top surface of the semiconductor material to modulate the implant depth and thus the thickness of a top doped layer. For example, the thickness of the resulting top doped layer can be inversely proportional or related to the thickness of the sacrificial hard mask layer. The hard mask layer can be, for example, a stacked layer of silicon oxide and silicon nitride. In some embodiments, the thickness of top doped layer can be modulated through implant process conditions (e.g., the implant energy). In some embodiments, the dopant dose for top doped layer can range from about $1 \times 10^{12}$ cm-2 to about $5 \times 10^{16}$ cm-2 and the dopant species can include either n-type (e.g., phosphorous, arsenic, or antimony) or p-type (e.g., boron, indium, or gallium).

In some embodiments, the dopants may be implanted using ion implantation to obtain a dopant gradient profile. One example of an ion implantation process to form the dopant gradient includes an ion beam energy in a range, for example, from approximately 1 KeV to approximately 15 KeV. The dopants are implanted to a depth at a bottom portion of the semiconductor material, for example, in a range from about 5 nm to about 20 nm in a dopant concentration in a range, for example, from about $1 \times 10^{19}$ cm$^{-3}$ to about $1 \times 10^{21}$ cm$^{-3}$. The dopants may, for example, be implanted to a depth at a middle portion of the gradient doped semiconductor material in a range from about 3 nm to about 15 nm in a dopant concentration in a range from about $5 \times 10^{18}$ cm$^{-3}$ to about $5 \times 10^{20}$ cm$^{-3}$. The dopants may, for example, be implanted to a depth at a top portion of the gradient doped semiconductor material in a range, for example, from about 1 nm to about 10 nm in a dopant concentration in a range from about $1 \times 10^{18}$ cm$^{-3}$ to about $1 \times 10^{20}$ cm$^{-3}$.

In some embodiments, the implantation process is followed by an annealing process. In certain embodiments, implantation of dopants into the semiconductor material is not followed with a post-anneal.

With reference to FIGS. 7A-7C, because of the doping gradient profile, a relatively lightly doped portion may be formed in heater 120 nearest insulator layer 140, a relatively heavily doped portion may be formed in heater 120 farthest from insulator layer 140, and a relatively medium doped portion may be formed in heater 120 between the relatively lightly doped portion and the relatively heavily doped portion.

Therefore, as understood by those of skill in the art, because of the doping gradient profile, when a voltage difference between the heater 120 and the PCM 180 is relatively low, a depletion region, having relatively few carriers is formed nearest the insulator layer 140. Accordingly, when the voltage difference between the heater 120 and the PCM 180 is relatively low, the capacitance between the heater 120 and the PCM 180 is relatively low the electrical and thermal conductivity of the heater 120 nearest the PCM 120 is also relatively low. Similarly, when a voltage difference between the heater 120 and the PCM 180 is relatively high, the depletion region nearest the insulator layer 140 is populated with relatively many carriers and is conductive. Accordingly, when the voltage difference between the heater 120 and the PCM 180 is relatively high, the capacitance between the heater 120 and the PCM 180 is relatively high and the electrical and thermal conductivity of the heater 120 nearest the PCM 120 is also relatively high.

To program the electrical conductivity of the electrical path between first and second terminals 110A and 110B a programming voltage difference profile is applied across first and second heater connections 120A and 120B. Current flowing through heater 120 according to the programming voltage difference profile causes the PCM 180 to be heated according to a temperature profile corresponding with the desired conductivity state of the PCM 180. For example, a first programming profile may be used to cause the PCM 180 to have a low-resistance, where the first programming profile applies a first temperature, greater than an operating temperature of the semiconductor heat control switch 100, to the semiconductor heat control switch 100 for a particular first time duration. In addition, a second programming profile may be used to cause the PCM 180 to have a high resistance, where the second programming profile applies a second temperature, greater than an operating temperature of the semiconductor heat control switch 100, and greater than the first temperature, to the semiconductor heat control switch 100 for a particular second time duration.

While programming the electrical conductivity of the electrical path between first and second terminals 110A and 110B, the thermal and electrical conductivity of the heater 120 nearest the PCM 180 is maintained at a relatively high level to, for example, induce an accumulation of carriers near the interface and reduce the depletion region between the heater 120 and the PCM 180. The thermal and electrical conductivity of the heater 120 nearest the PCM 180 may be maintained at a relatively high level to by conducting the programming operation with a relatively high voltage difference between the heater 120 and the PCM 180. For example, the relatively high voltage difference between the heater 120 and the PCM 180 may be greater than any of about 0.5 V, about 0.6 V, about 0.7 V, about 0.8 V, about 0.9 V, about 1 V, about 1.1 V, about 1.2 V, about 1.3 V, about 1.4 V, about 1.5 V, about 2 V, about 2.5 V, and another voltage.

While not programming the electrical conductivity of the electrical path between first and second terminals 110A and 110B, the capacitance between the heater 120 and the PCM 180 is maintained at a relatively low level to, for example, maintain the depletion region between the heater 120 and the PCM 180. The capacitance between the heater 120 and the PCM 180 may be maintained by maintaining a relatively low voltage difference between the heater 120 and the PCM 180 during non-programming operation. For example, the relatively low voltage difference between the heater 120 and the PCM 180 may be less than any of about 0.5 V, about 0.6 V, about 0.7 V, about 0.8 V, about 0.9 V, about 1 V, about 1.1 V, about 1.2 V, about 1.3 V, about 1.4 V, about 1.5 V, about 2 V, about 2.5 V, and another voltage.

Accordingly, by maintaining a proper voltage difference between the heater 120 and the PCM 180 high conductivity may be advantageously used when programming semiconductor heat control switch 100, and low capacitance may be advantageously attained for non-programming operation.

Semiconductor Diode Implementation

In some embodiments, heater 120 is formed by depositing and etching a semiconductor material to form a diode. In some embodiments, the semiconductor material is amorphous. In some embodiments, the semiconductor material is polycrystalline. In some embodiments the semiconductor material is substantially single-crystalline.

In some embodiments, the semiconductor material comprises at least one of: silicon and one or more other semiconductor materials known to those of skill in the art.

In some embodiments, the semiconductor material is deposited by one or more of a sputtering process, a chemical vapor deposition (CVD), a variety of suitable processes including CVD, low pressure CVD (LPCVD), plasma-enhanced CVD (PECVD), and atomic layer deposition (ALD), or a crystal growth process, such as an epitaxial crystal growth process.

In some embodiments, the semiconductor material is formed with a thickness equal to about 10 Å, about 20 Å, about 25 Å, about 50 Å, about 75 Å, about 100 Å, about 200 Å, about 300 Å, about 400 Å, about 500 Å, about 600 Å, about 700 Å, about 800 Å, about 900 Å, about 1000 Å, about 1100 Å, about 1200 Å, about 1300 Å, about 1400 Å, about 1500 Å, about 1600 Å, about 1700 Å, about 1800 Å, about 1900 Å, or about 2000 Å.

In some embodiments semiconductor material is doped, for example, using an implant process to form a diode. By way of example and not limitation, semiconductor material can be doped during the process of forming source/drain regions in transistor devices. By way of example and not limitation, a sacrificial hard mask layer can be formed on the top surface of the semiconductor material to modulate the implant depth and thus the thickness of a top doped layer. For example, the thickness of the resulting top doped layer can be inversely proportional or related to the thickness of the sacrificial hard mask layer. The hard mask layer can be, for example, a stacked layer of silicon oxide and silicon nitride. In some embodiments, the thickness of top doped layer can be modulated through implant process conditions (e.g., the implant energy). In some embodiments, the dopant dose for top doped layer can range from about $1 \times 10^{12}$ cm-2 to about $5 \times 10^{16}$ cm-2 and the dopant species can include either n-type (e.g., phosphorous, arsenic, or antimony) or p-type (e.g., boron, indium, or gallium). In some embodiments, the thickness of a bottom doped layer can be modulated through implant process conditions (e.g., the implant energy). In some embodiments, the dopant dose for the bottom doped layer can range from about $1 \times 10^{12}$ cm-2 to about $5 \times 10^{16}$ cm-2 and the dopant species can include either n-type (e.g., phosphorous, arsenic, or antimony) or p-type (e.g., boron, indium, or gallium) and is of opposite conductivity type as that of the top doped layer. Accordingly, the top and bottom doped layers form a pn junction diode.

One example of an ion implantation process to form the dopant gradient includes an ion beam energy in a range, for example, from approximately 1 KeV to approximately 15 KeV. The dopants are implanted to a depth at a bottom portion of the semiconductor material, for example, in a range from about 5 nm to about 20 nm in a dopant concentration in a range, for example, from about $1 \times 10^{19}$ cm$^{-3}$ to about $1 \times 10^{21}$ cm$^{-3}$. The dopants may, for example, be implanted to a depth at a top portion of the semiconductor material in a range, for example, from about 1 nm to about 10 nm in a dopant concentration in a range from about $1 \times 10^{19}$ cm$^{-3}$ to about $1 \times 10^{21}$ cm$^{-3}$.

In some embodiments, the implantation process is followed by an annealing process. In certain embodiments, implantation of dopants into the semiconductor material is not followed with a post-anneal.

Therefore, as understood by those of skill in the art, because of the diode, when a voltage difference between the n-type diode layer and the p-type diode layer of heater 120 causes the diode to be reverse biased, a depletion region, having relatively few carriers is formed between the n-type diode layer and the p-type diode layer of the heater 120. Accordingly, when the diode is reverse biased, the capacitance between the heater 120 and the PCM 180 is relatively low and the electrical and thermal conductivity of the heater 120 is also relatively low. Similarly, when a voltage difference between the n-type diode layer and the p-type diode layer of heater 120 causes the diode to be forward biased, the depletion region of the diode is populated with relatively many carriers and is conductive. Accordingly, when the diode is forward biased, the capacitance between the heater 120 and the PCM 180 is relatively high and the electrical and thermal conductivity of the heater 120 is also relatively high.

To program the electrical conductivity of the electrical path between first and second terminals 110A and 110B a programming voltage difference profile is applied across first and second heater connections 120A and 120B, where first and second heater connections 120A and 120B are each connected to one of the n-type and p-type layers, and where the diode of heater 120 is forward biased. Current flowing through heater 120 according to the programming voltage difference profile causes the PCM 180 to be heated according to a temperature profile corresponding with the desired conductivity state of the PCM 180. For example, a first programming profile may be used to cause the PCM 180 to have a low-resistance, where the first programming profile applies a first temperature, greater than an operating temperature of the semiconductor heat control switch 100, to the semiconductor heat control switch 100 for a particular first time duration. In addition, a second programming profile may be used to cause the PCM 180 to have a high resistance, where the second programming profile applies a second temperature, greater than an operating temperature of the semiconductor heat control switch 100, and greater than the first temperature, to the semiconductor heat control switch 100 for a particular second time duration.

While programming the electrical conductivity of the electrical path between first and second terminals 110A and 110B, the thermal and electrical conductivity of the heater 120 is maintained at a relatively high level by maintaining a voltage difference between the n-type layer and the p-type layer of heater 120 which causes the diode of heater 120 to be forward biased during the programming operation.

While not programming the electrical conductivity of the electrical path between first and second terminals 110A and 110B, the capacitance between the heater 120 and the PCM 180 is maintained at a relatively low level by maintaining a voltage difference between the n-type layer and the p-type layer of heater 120 which causes the diode of heater 120 to be reverse biased during non-programming operation.

Accordingly, by maintaining a proper voltage difference between the n-type layer and the p-type layer of heater 120, high conductivity may be advantageously used when programming semiconductor heat control switch 100, and low capacitance may be advantageously attained for non-programming operation.

Schottky Diode Implementation

In some embodiments, heater 120 is formed by depositing and etching a metal and a semiconductor material to form a Schottky diode. In some embodiments, the metal is nearer the PCM 180 than the semiconductor material. In some embodiments, the semiconductor material is nearer the PCM 180 than the metal.

The metal may, for example, be formed so as to include one or more of Cu, Ag, Pt, Au, W, Ti, TiN, TaN, Ru, and Mo. In some embodiments, other materials may be used. The metal may, for example, have a thickness equal to about 10 Å, about 25 Å, about 50 Å, about 75 Å, about 100 Å, about 200 Å, about 300 Å, about 400 Å, about 500 Å, about 600 Å, about 700 Å, about 800 Å, about 900 Å, or about 1000 Å. In some embodiments, the bottom electrode 230 has another thickness. In some embodiments, the metal is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the metal.

In some embodiments, the semiconductor material is amorphous. In some embodiments, the semiconductor material is polycrystalline. In some embodiments the semiconductor material is substantially single-crystalline. In some embodiments, the semiconductor material comprises at least one of: silicon and one or more other semiconductor materials known to those of skill in the art. In some embodiments, the semiconductor material is deposited by one or more of a sputtering process, a chemical vapor deposition (CVD), a variety of suitable processes including CVD, low pressure CVD (LPCVD), plasma-enhanced CVD (PECVD), and atomic layer deposition (ALD), or a crystal growth process, such as an epitaxial crystal growth process. In some embodiments, the semiconductor material is formed with a thickness equal to about 10 Å, about 20 Å, about 25 Å, about 50 Å, about 75 Å, about 100 Å, about 200 Å, about 300 Å, about 400 Å, about 500 Å, about 600 Å, about 700 Å, about 800 Å, about 900 Å, about 1000 Å, about 1100 Å, about 1200 Å, about 1300 Å, about 1400 Å, about 1500 Å, about 1600 Å, about 1700 Å, about 1800 Å, about 1900 Å, or about 2000 Å.

In some embodiments semiconductor material is doped, for example, using an implant process. By way of example and not limitation, the semiconductor material can be doped during the process of forming source/drain regions in transistor devices. By way of example and not limitation, a sacrificial hard mask layer can be formed on the top surface of the semiconductor material to modulate the implant depth and thus the thickness of a top doped layer. For example, the thickness of the resulting top doped layer can be inversely proportional or related to the thickness of the sacrificial hard mask layer. The hard mask layer can be, for example, a stacked layer of silicon oxide and silicon nitride. In some embodiments, the thickness of top doped layer can be modulated through implant process conditions (e.g., implant energy). In some embodiments, the dopant dose for doping the semiconductor material can range from about $1\times10^{12}$ cm-2 to about $5\times10^{16}$ cm-2 and the dopant species can include either n-type (e.g., phosphorous, arsenic, or antimony) or p-type (e.g., boron, indium, or gallium). Accordingly, the metal and the doped semiconductor material form a Schottky barrier diode.

One example of an ion implantation process to form the dopant gradient includes an ion beam energy in a range, for example, from approximately 1 KeV to approximately 15 KeV. The dopants may, for example, be implanted to a depth in a range, for example, from about 1 nm to about 10 nm in a dopant concentration in a range from about $1\times10^{19}$ cm$^{-3}$ to about $1\times10^{21}$ cm$^{-3}$.

In some embodiments, the implantation process is followed by an annealing process. In certain embodiments, implantation of dopants into the semiconductor material is not followed with a post-anneal.

Therefore, as understood by those of skill in the art, because of the Schottky diode, when a voltage difference between the metal and the doped semiconductor of heater 120 causes the Schottky diode to be reverse biased, a depletion region, having relatively few carriers is formed between the metal and the doped semiconductor of the heater 120. Accordingly, when the Schottky diode is reverse biased, the capacitance between the heater 120 and the PCM 180 is relatively low and the electrical and thermal conductivity of the heater 120 is also relatively low. Similarly, when a voltage difference between the metal and the doped semiconductor of heater 120 causes the Schottky diode to be forward biased, the depletion region of the Schottky diode is populated with relatively many carriers and is conductive. Accordingly, when the Schottky diode is forward biased, the capacitance between the heater 120 and the PCM 180 is relatively high and the electrical and thermal conductivity of the heater 120 is also relatively high.

To program the electrical conductivity of the electrical path between first and second terminals 110A and 110B a programming voltage difference profile is applied across first and second heater connections 120A and 120B, where first and second heater connections 120A and 120B are each connected to one of the metal and the doped semiconductor, and where the Schottky diode of heater 120 is forward biased. Current flowing through heater 120 according to the programming voltage difference profile causes the PCM 180 to be heated according to a temperature profile corresponding with the desired conductivity state of the PCM 180. For example, a first programming profile may be used to cause the PCM 180 to have a low-resistance, where the first programming profile applies a first temperature, greater than an operating temperature of the semiconductor heat control switch 100, to the semiconductor heat control switch 100 for a particular first time duration. In addition, a second programming profile may be used to cause the PCM 180 to have a high resistance, where the second programming profile applies a second temperature, greater than an operating temperature of the semiconductor heat control switch 100, and greater than the first temperature, to the semiconductor heat control switch 100 for a particular second time duration.

While programming the electrical conductivity of the electrical path between first and second terminals 110A and 110B, the thermal and electrical conductivity of the heater 120 is maintained at a relatively high level by maintaining a voltage difference between the metal and the doped semiconductor of heater 120 which causes the Schottky diode of heater 120 to be forward biased during the programming operation.

While not programming the electrical conductivity of the electrical path between first and second terminals 110A and 110B, the capacitance between the heater 120 and the PCM 180 is maintained at a relatively low level by maintaining a voltage difference between the metal and the doped semiconductor of heater 120 which causes the Schottky diode of heater 120 to be reverse biased during non-programming operation.

Accordingly, by maintaining a proper voltage difference between the metal and the doped semiconductor of heater 120, high conductivity may be advantageously used when programming semiconductor heat control switch 100, and low capacitance may be advantageously attained for non-programming operation.

One inventive aspect is a semiconductor device. The semiconductor device includes a semiconductor substrate, and a heater element on the semiconductor substrate, the heater element configured to generate heat in response to a current flowing therethrough. The semiconductor device also includes a conductor material having a programmable conductivity, and an insulator layer between the heater element and the conductor material, where the conductor material is configured to be programmed by applying one or more voltage differences to one or more of the heater element and the conductor material, and where a capacitance between the conductor material and the heater element is configured to be controlled by the voltage differences such that the capacitance is lower while the conductor material is being programmed than while the conductor material is not being programmed.

In some embodiments, the heater includes a semiconductor material.

In some embodiments, the semiconductor material has a plurality of doping concentrations each corresponding with a depth of the semiconductor material.

In some embodiments, the semiconductor material forms a diode.

In some embodiments, the heater includes a conductor element, and the semiconductor material and the conductor element cooperatively form a Schottky diode.

In some embodiments, the conductor material includes a phase change material (PCM).

Another inventive aspect is a method of using a semiconductor device, the semiconductor device including a semiconductor substrate, a heater element on the semiconductor substrate, the heater element configured to generate heat in response to a current flowing therethrough, a conductor material having a programmable conductivity, and an insulator layer between the heater element and the conductor material. The method includes applying one or more first voltage differences to the heater element to selectively program an electrical conductivity of the conductor material, and applying one or more second voltage differences to one or more of the heater element and the conductor material to control a capacitance between the heater element and the conductor material.

In some embodiments, the method also includes controlling the capacitance between the heater element and the conductor material such that the capacitance is lower while the conductor material is being programmed than while the conductor material is not being programmed.

In some embodiments, the method also includes applying the second voltage differences across the heater element and the conductor material to control the capacitance.

In some embodiments, applying the second voltage differences across the heater element and the conductor material selectively cause a depletion region to develop.

In some embodiments, first voltage differences causing the electrical conductivity of the conductor material to be programmed are applied to the heater element while second voltage differences are applied across the heater element and the conductor material which cause a depletion region to be populated with additional carriers.

In some embodiments, first voltage differences causing the electrical conductivity of the conductor material to not be programmed are applied to the heater element while second voltage differences are applied across the heater element and the conductor material which cause a depletion region to form.

In some embodiments, the method also includes applying the second voltage differences across the heater element to control the capacitance.

In some embodiments, applying the second voltage differences across the heater element selectively causes a diode to be forward and reverse biased.

In some embodiments, first voltage differences causing the electrical conductivity of the conductor material to be programmed are applied to the heater element while second voltage differences are applied across the heater element which cause the diode to be forward biased.

In some embodiments, first voltage differences causing the electrical conductivity of the conductor material to not be programmed are applied to the heater element while second voltage differences are applied across the heater element which cause the diode to be reverse biased.

Another inventive aspect is a semiconductor device, including a semiconductor substrate, and a heater element on the semiconductor substrate, the heater element configured to generate heat in response to a current flowing therethrough. The semiconductor device also includes a conductor material having a programmable conductivity, and an insulator layer between the heater element and the conductor material, where a capacitance between the conductor material and the heater element is configured to be controlled such that the capacitance is lower while the conductor material is being programmed than while the conductor material is not being programmed.

In some embodiments, the heater includes a semiconductor material.

In some embodiments, the semiconductor material forms a depletion region.

In some embodiments, the conductor material includes a phase change material (PCM). In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a heater element on the semiconductor substrate, the heater element configured to generate heat in response to a current flowing therethrough;
   a conductor material having a programmable conductivity; and
   an insulator layer between the heater element and the conductor material,
   wherein the conductor material is configured to be programmed by applying one or more voltage differences to one or more of the heater element and the conductor material, and
   wherein a capacitance between the conductor material and the heater element is configured to be controlled by the voltage differences such that the capacitance is lower while the conductor material is being programmed than while the conductor material is not being programmed.

2. The semiconductor device of claim 1, wherein the heater element comprises a semiconductor material.

3. The semiconductor device of claim 2, wherein the semiconductor material has a plurality of doping concentrations each corresponding with a depth of the semiconductor material.

4. The semiconductor device of claim 2, wherein the semiconductor material forms a diode.

5. The semiconductor device of claim 2, wherein the heater element comprises a conductor element, and the semiconductor material and the conductor element cooperatively form a Schottky diode.

6. The semiconductor device of claim 1, wherein the conductor material comprises a phase change material (PCM).

7. A method of using a semiconductor device, the semiconductor device comprising
   a semiconductor substrate;
   a heater element on the semiconductor substrate, the heater element configured to generate heat in response to a current flowing therethrough;
   a conductor material having a programmable conductivity, and
   an insulator layer between the heater element and the conductor material,
   the method comprising:
   applying one or more first voltage differences to the heater element to selectively program an electrical conductivity of the conductor material; and
   applying one or more second voltage differences to one or more of the heater element and the conductor material to control a capacitance between the heater element and the conductor material.

8. The method of claim 7, further comprising controlling the capacitance between the heater element and the conductor material such that the capacitance is lower while the conductor material is being programmed than while the conductor material is not being programmed.

9. The method of claim 7, further comprising applying the second voltage differences across the heater element and the conductor material to control the capacitance.

10. The method of claim 9, wherein applying the second voltage differences across the heater element and the conductor material selectively cause a depletion region to develop.

11. The method of claim 10, wherein first voltage differences causing the electrical conductivity of the conductor material to be programmed are applied to the heater element while second voltage differences are applied across the heater element and the conductor material which cause a depletion region to be populated with additional carriers.

12. The method of claim 10, wherein first voltage differences causing the electrical conductivity of the conductor material to not be programmed are applied to the heater element while second voltage differences are applied across the heater element and the conductor material which cause a depletion region to form.

13. The method of claim 7, further comprising applying the second voltage differences across the heater element to control the capacitance.

14. The method of claim 13, wherein applying the second voltage differences across the heater element selectively causes a diode to be forward and reverse biased.

15. The method of claim 14, wherein first voltage differences causing the electrical conductivity of the conductor material to be programmed are applied to the heater element while second voltage differences are applied across the heater element which cause the diode to be forward biased.

16. The method of claim 14, wherein first voltage differences causing the electrical conductivity of the conductor material to not be programmed are applied to the heater element while second voltage differences are applied across the heater element which cause the diode to be reverse biased.

17. A semiconductor device, comprising:
    a semiconductor substrate;
    a heater element on the semiconductor substrate, the heater element configured to generate heat in response to a current flowing therethrough;
    a conductor material having a programmable conductivity; and
    an insulator layer between the heater element and the conductor material,
    wherein a capacitance between the conductor material and the heater element is configured to be controlled such that the capacitance is lower while the conductor material is being programmed than while the conductor material is not being programmed.

18. The semiconductor device of claim 17, wherein the heater element comprises a semiconductor material.

19. The semiconductor device of claim 18, wherein the semiconductor material forms a depletion region.

20. The semiconductor device of claim 17, wherein the conductor material comprises a phase change material (PCM).

* * * * *